United States Patent [19]
Harris et al.

[11] Patent Number: 6,091,108
[45] Date of Patent: Jul. 18, 2000

[54] SEMICONDUCTOR DEVICE OF SIC HAVING AN INSULATED GATE AND BURIED GRID REGION FOR HIGH BREAKDOWN VOLTAGE

[75] Inventors: Christopher Harris, Sollentuna; Bo Bijlenga, Skultuna; Lennart Zdansky, Västerås; Ulf Gustafsson, Linköping; Mietek Bakowski, Skultuna; Andrey Konstantinov, Järfälla, all of Sweden

[73] Assignee: ABB Research Ltd., Zurich, Switzerland

[21] Appl. No.: 08/971,682

[22] Filed: Nov. 17, 1997

[51] Int. Cl.[7] .......................... H01L 29/78; H01L 29/745
[52] U.S. Cl. .......................... 257/339; 257/168; 257/495; 257/496; 257/173; 257/77; 257/135
[58] Field of Search .............................. 257/496, 77, 135, 257/173; 255/495, 168, 339

[56] References Cited

U.S. PATENT DOCUMENTS

| | | | |
|---|---|---|---|
| 3,571,675 | 3/1971 | Faust | 317/235 |
| 4,003,072 | 1/1977 | Matsushita et al. | 357/52 |
| 4,060,821 | 11/1977 | Houston et al. | 357/22 |
| 4,132,996 | 1/1979 | Baliga | 357/21 |
| 4,151,540 | 4/1979 | Sander et al. | |
| 4,379,726 | 4/1983 | Kumamaru et al. | |
| 4,821,095 | 4/1989 | Temple | 357/23.4 |
| 4,984,049 | 1/1991 | Nishizawa et al. | |
| 5,191,396 | 3/1993 | Lidow et al. | 257/339 |
| 5,218,226 | 6/1993 | Slatter et al. | 257/546 |
| 5,223,737 | 6/1993 | Canclini | |
| 5,389,815 | 2/1995 | Takahashi | 257/605 |
| 5,514,608 | 5/1996 | Williams et al. | 437/44 |
| 5,569,941 | 10/1996 | Takahashi | 257/133 |
| 5,681,762 | 10/1997 | Baliga | |
| 5,742,076 | 4/1998 | Sridevan et al. | 257/77 |
| 5,895,939 | 4/1999 | Ueno | 257/279 |

*Primary Examiner*—Jerome Jackson, Jr.
*Attorney, Agent, or Firm*—Pollock, Vande Sande & Amernick

[57] ABSTRACT

A semiconductor device of SiC is adapted to hold high voltages in the blocking state thereof. The device comprises two parts (1, 2) each comprising one or more semiconductor layers of SiC and connected in series between two opposite terminals of the device, namely a sub-semiconductor device (1) able to withstand only low voltages in the blocking state thereof and a voltage-limiting part (2) able to withstand high voltages in the blocking state of the device and adapted to protect said sub-semiconductor device by taking a major part of the voltage over the device in the blocking state thereof.

17 Claims, 4 Drawing Sheets

SEMICONDUCTOR DEVICE OF SIC HAVING AN INSULATED GATE AND BURIED GRID REGION FOR HIGH BREAKDOWN VOLTAGE

FIELD OF THE INVENTION

The present invention relates to a semiconductor device of SiC comprising three terminals so that a high voltage can be maintained between two of the terminals in a blocking state of the device, the third terminal being used as a is controlling electrode such that the device has a transistor action and being of the insulated gate type as well as a transistor of SiC having an insulated gate.

BACKGROUND OF THE INVENTION

It is well known that semiconductor devices fabricated from SiC are in principle able to withstand high voltages in the blocking state of the device due to the fact that SiC has a very high breakdown field, approximately ten times higher than for Si. However, the devices have to be passivated by an insulating layer, which may be for instance $SiO_2$, and devices having an insulated gate also have an insulating layer, which may also be for instance $SiO_2$. In known devices the presence of such insulating layers places significant restrictions uses of the high breakdown field strength that would otherwise be possible for Sic-devices considering the properties of Sic itself. For instance in the case of insulating layers of $SiO_2$, the dielectric constant in $SiO_2$ is lower than in SiC, which means that the electric field will be higher in $SiO_2$ according to the inverse ratio of the dielectric constant. A low field in the $SiO_2$ layer is, however, beneficial to the long term stability and reliability of the insulating layer. At the maximum field strength of SiC (2 MV/cm) the corresponding field in $SiO_2$ would be >5 MV/cm which is generally considered as too high for stable device operation. Accordingly, it is necessary for protecting the insulating layer to restrict the maximum electric field in the SiC layers close to the insulating layers to a much lower level than SiC allows according to the dielectric strength of the oxide.

Accordingly, it is desirable to construct semiconductor devices of SiC in which the insulating layers are protected so utilize as much as possible the property capable to hold high voltages in the blocking state. It will then be particularly important to protect an insulating layer of a gate, since this will be much thinner than a passivation layer and the electric field will therefore be higher.

SUMMARY OF THE INVENTION

The object of the present invention is to provide a semiconductor device of SiC and a transistor of SiC having an insulated gate defined in the introduction, which allow it to better benefit from the superior property of SiC, as compared to Si, and allow it to withstand high electric fields in a blocking state of the device better than in already known devices.

This object is according to the present invention obtained by providing a semiconductor device of SiC comprising two parts, each comprising one or more semiconductor layers of SiC and connected in series between said connections, namely a sub-semiconductor device able to withstand only low voltages in the blocking state thereof and a voltage-limiting part able to withstand high voltages in the blocking state of the device and adapted to protect the sub-semiconductor device by taking a major part of the voltage over the device in the blocking state thereof.

A semiconductor device being able to withstand high voltages in the blocking state thereof is in this way obtained, but the electric field is in the blocking state of the device kept at a low level in the sub-semiconductor device, so that insulating layers for passivation and especially the ones for insulating a gate are protected.

According to a preferred embodiment of the invention the voltage-limiting part of the device comprises at least one region of a first conductivity type buried in a layer of an opposite second conductivity type at a distance below the sub-semiconductor device. Such a buried region will result in a reduced electric field in the sub-semiconductor device, which means that insulating layers located therein may be better protected. Furthermore, channel region layers, when such exist and which normally will see the maximum field may now be given a lower doping concentration and/or be made thinner to reduce the on-state resistance of such a device.

According to another preferred embodiment of the invention the device comprises more than one buried region laterally spaced and forming a grid adapted to form a continuous layer of the first conductivity type in the blocking state of the device and by that a pn-junction at a distance from the sub-semiconductor device taking a major part of the voltage over the device in a blocking state thereof. Such a buried grid structure acts as a potential divider and thereby allows the field in the region above the grid to be controlled. Accordingly, the major voltage over such a device in the blocking state thereof and by that the high electric field will be taken away from the sub-semiconductor device and insulating layers thereof will be protected.

The object of the present invention is also obtained by providing a transistor of SiC having an insulated gate as defined in the introduction with at least one additional p-type region buried in the drift layer at a distance below the p-type channel region layer and adapted to reduce the electric field to be taken by the channel region layer in the blocking state of the transistor. Due to the fact that such a buried region will reduce the electric field to be taken by the channel region layer, this region may be given a lower doping concentration and/or be made thinner. This results in a higher mobility due to a lower threshold voltage for forming the inversion channel and a lower on-state resistance of a channel region layer. The reduced electric field at the channel region layer will also result in a lower electric field in the gate insulating layer, so that a higher total voltage may be held by the device before this insulating layer is destroyed.

According to another preferred embodiment of the invention the transistor comprises more than one the buried region laterally spaced and forming a grid adapted to form a continuous p-type layer in the blocking state of the transistor and by that a pn-junction at a distance below the p-type channel region layer taking a major part of the voltage drop over the transistor in a blocking state thereof. This means that the highest electric field of the device in the blocking state thereof will be at the pn-junction deep in the drift layer and the electric field will be much lower close to the channel region layer, which in a conventional design of a MISFET and/or IGBT would see the maximum field. Accordingly, the gate insulating layer will only experience a low electric field despite of a high voltage drop over the entire device. This also means that less charge will be needed in the channel region layer for holding a voltage applied thereon, which results in a lower threshold voltage and a higher mobility in the inversion channel.

According to another preferred embodiment of the invention the transistor comprises a plurality of active regions laterally spaced with respect to each other and arranged with a fixed pitch, and the pitch and the spacing between the additional regions of the buried grid are selected to obtain a desired on-state resistance and breakdown voltage, respectively, of the transistor. This design of a transistor makes it possible to obtain a device having exactly the properties desired in a particular case with respect to on-state resistance and breakdown voltage. Thus, it will be possible to vary the spacing for controlling the breakdown voltage of the transistor. By changing the pitch, the on-state resistance and the saturation current density of the device will be varied. Thus, the dimension of the grid will be optimized to form a trade-off between voltage blocking capability and parasitic contribution of a grid to on-state losses.

According to a preferred embodiment of the invention the transistor has the insulating layer arranged on top of the channel region layer and the gate electrode on top thereof for forming a lateral conducting inversion channel between the source region layer and the drift layer. A transistor having such an active region has turned out to be very advantageous and the channel region layer may especially be made as thin as possible thanks to the low electric field in the blocking state of the device resulting in a low on-state resistance of the transistor.

According to another preferred embodiment of the invention the buried region is highly doped. This will result in a concentration of the electric field in the blocking state of the device to this buried region, and especially in the case of a buried grid this means that the pn-junction formed thereby in the blocking state of the device will take the major part of the voltage over the device.

According to another preferred embodiment of the invention the channel region layer is low doped, and it has preferably a doping concentration between $10^{16}$ and $5 \times 10^{17}$ $cm^{-3}$, which means a comparatively low threshold voltage for forming a conducting inversion channel therein and by that a high mobility in the channel and a reduction of the electric field over the gate dielectric.

According to another preferred embodiment of the invention the channel region layer is thin in the direction of the channel resulting in a short inversion channel therein, and the length of the channel is preferably less than 1 $\mu$m. Such a short channel is made possible by the reduction of the electric field in this part of the transistor in the blocking state thereof, which means a reduction of the on-state resistance of the transistor.

Further advantages and advantageous features of the device and transistor according to the present invention appear from the following description.

BRIEF DESCRIPTION OF THE DRAWINGS

With reference to the appended drawings, below follows a specific description of preferred embodiments of the invention cited as examples.

In the drawings.

DETAILED DESCRIPTION OF THE PREFERRED EMBODIMENTS

Figure 1:
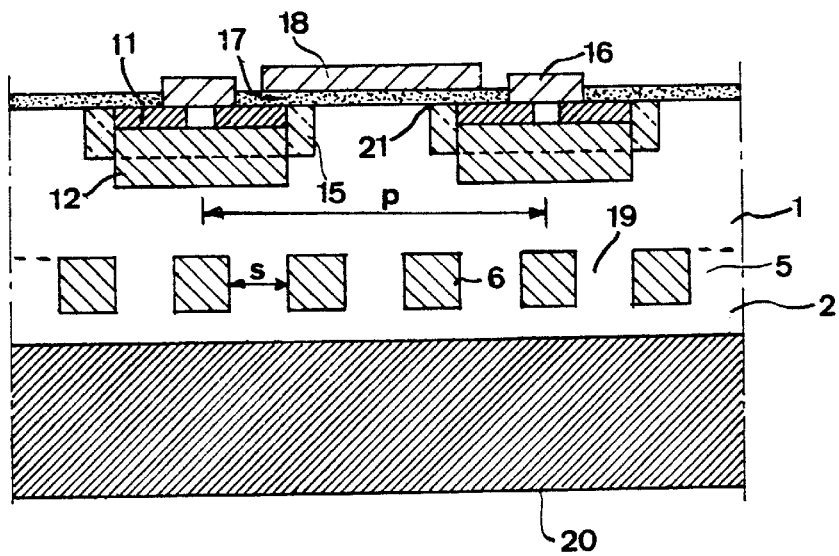
FIG. 1 is a simplified cross-section view of a semiconductor device according to a first preferred embodiment of the invention.
Figure 2:
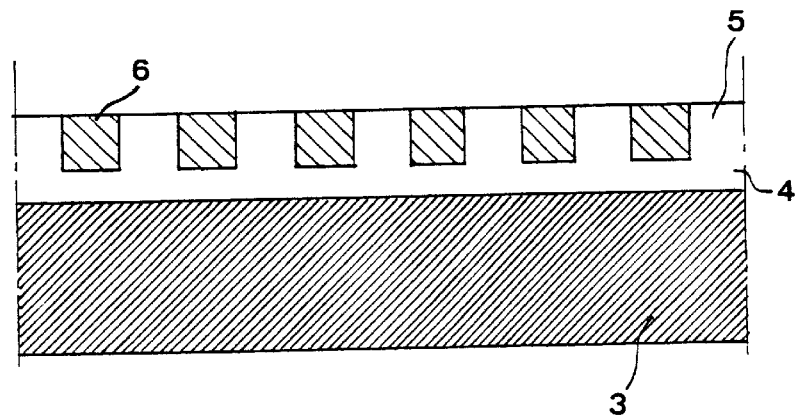
FIGS. 2 and 3 are simplified section views illustrating the most important steps of a method for producing the voltage limiting part of the semiconductor device according to FIG. 1, FIGS. 4–6 are simplified section views illustrating the most important steps of another method for producing the voltage limiting part of the semiconductor device according to FIG. 1, FIGS. 7–10 are simplified section views illustrating the most important steps of a method for producing the active region, i.e. the real transistor part, of a semiconductor device according to FIG. 1.

A MISFET made of SiC according to a first preferred embodiment of the invention is illustrated in FIG. 1. However, it should be noted that the relative dimensions of the layers and regions in this device shown in this figure have only been chosen for the sake of clarity of the drawing. This device comprises an upper sub-semiconductor device in the form of a MISFET structure 1 (Metal-Insulating layer Semiconductor Field Effect Transistor) and a lower voltage-limiting part 2 having a JFET-like structure (JFET=Junction Field Effect Transistor). The lower part 2 may be produced by utilizing a method described in the U.S. patent application Ser. No. 08/636,969, and the upper part is subsequently produced on top of the lower part by utilizing a method described in the U.S. patent application Ser. No. 08/678,548 of the assignee of the present application. The present invention describes how here two concepts may be combined in a new device that can be optimized using the independent parameters defined by the aforementioned applications. How the production of the preferred device illustrated in FIG. 1 will be accomplished will now be explained while referring to FIGS. 2–10. It is emphasized that the method for producing the transistor shown in FIG. 1 also comprises several masking and demasking steps as well as annealing steps after implantation, which, however, have nothing to do with the invention, and they will not be further described here.

First a highly doped n-type substrate 3 is provided and a low-doped n-type drift layer 4 of SiC is epitaxially grown thereon, preferably by Chemical Vapor Deposition. Any suitable donor, such as nitrogen or phosphorus, may be used for obtaining the doping of these layers. Typical doping concentrations may be $10^{15}$–$10^{16}$ $cm^{-3}$ and $10^{18}$–$10^{20}$ $cm^{-3}$ for the drift layer and the substrate layer, respectively. After masking and patterning the mask, impurity dopants of p-type are implanted into the drift layer 4 by using a high acceleration energy, so that a grid 5 formed by a number of laterally spaced regions 6 is produced. These p-type regions 6 have a high doping concentration, typically $10^{19}$–$10^{20}$ $cm^{-3}$. The dopants of the regions 6 are then made electrically active by annealing these regions at a high temperature. After a demasking step a n-type low doped layer 7 of SiC is epitaxially grown on top of the layer 4 by Chemical Vapor-Deposition. The layers 4 and 7 form in practice together a drift layer of a transistor being manufactured in this way, and a grid 5 buried deep into the drift layer may in this way easily be achieved by this regrowth technique.

Figure 3:
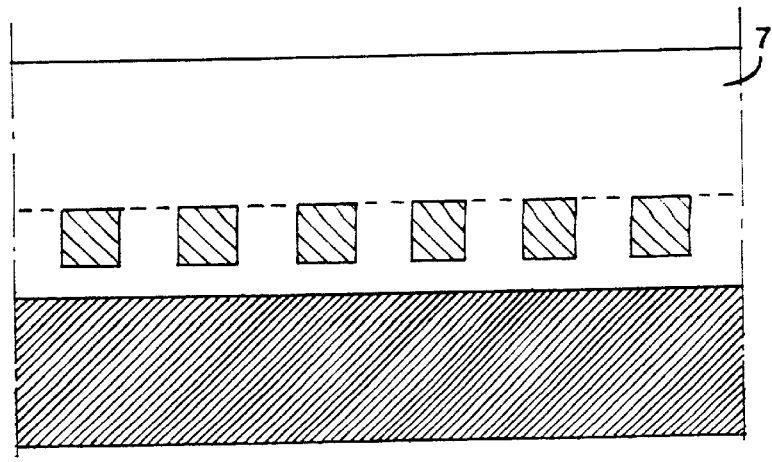
Figure 4:
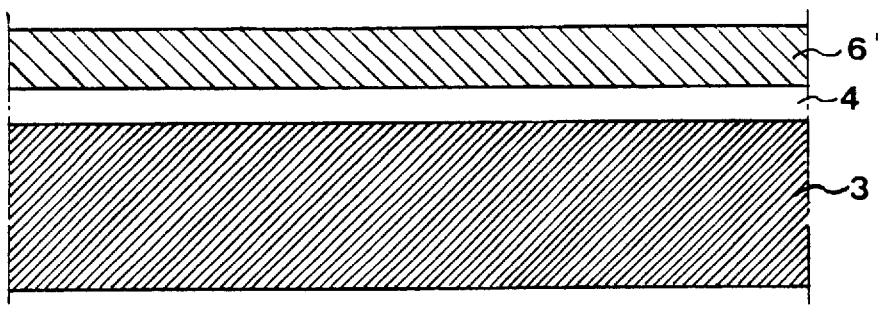
Figure 5:
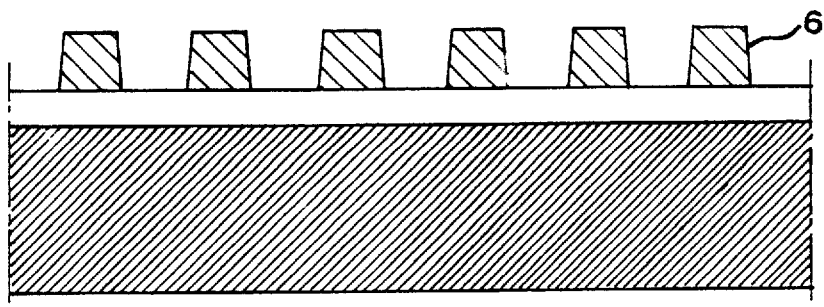
Figure 6:
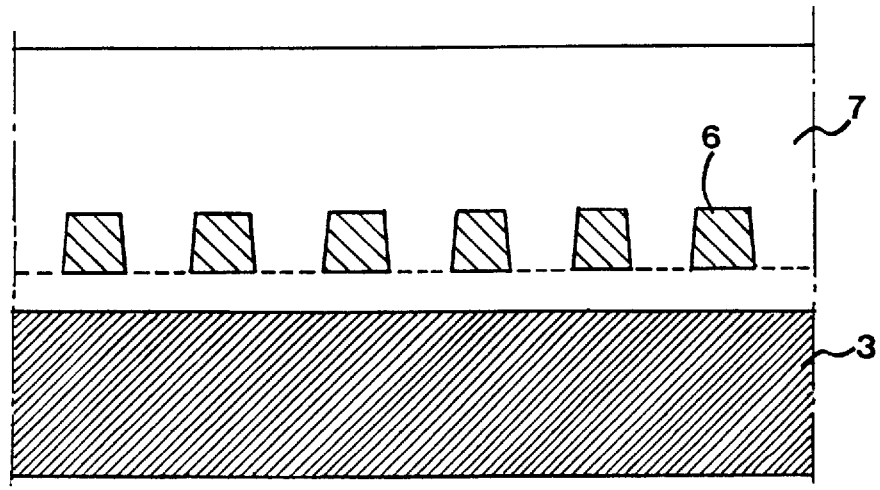
Figure 7:
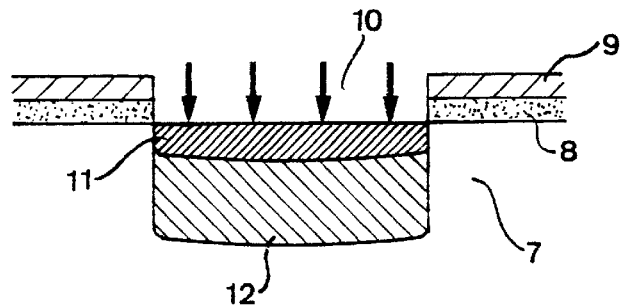
Figure 8:
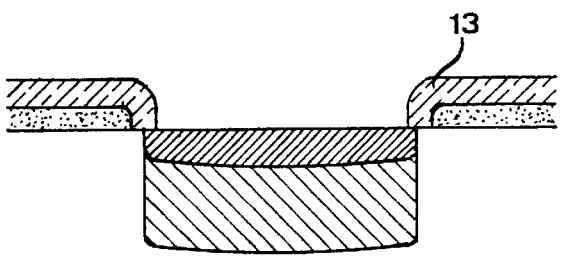
Figure 9:
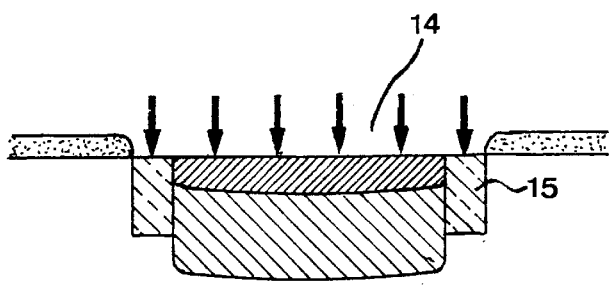

FIGS. 4–6 illustrates another way of obtaining the structure shown in FIG. 3. In this method a low doped n-type drift layer part 4 is epitaxially grown on the substrate 3, and a highly doped p-type layer 6' is after that epitaxially grown onto the layer 4. The layer 6' is after that patterned, for instance by reactive ion etching, for forming n-type regions 6 with a certain spacing therebetween. A regrowth of a low doped n-type drift layer 7 on top of the patterned structure is after that carried out.

After forming the voltage limiting part according to FIGS. 2 and 3 or FIGS. 4–6, the MOSFET- or MISFET-part of the device is produced according to FIGS. 7–10. First, a layer 8 of silicon being polycrystalline or amorphous is applied on top of the drift layer part 7. On top of the layer 8 a further layer 9 of a masking material, such as a metal, is applied. After etching an aperture 10, n-dopants are implanted into a surface-near layer 11, so that this will get a high doping concentration. Next that p-dopants are also implanted, but using higher acceleration energies, so as to form a deep base layer 12 with a high concentration of acceptors. A surface layer 13 of a certain thickness of the silicon layer 8 is then oxidized at high temperature, so that a layer 13 of oxide (SiO$_2$) is formed. The oxidized surface layer 13 is then removed by wet etching, and after that dopants of p-type are implanted into an area of the SiC layer defined by the aperture 14 formed by the removal of the oxidized layer 13 to such a degree that the doping type of the surface-near layer 11 previously created is maintained but the doping type of a second surface-near layer 15 exposed through the removal is changed for forming a p-doped channel region layer with a lateral extension determined by the thickness of the oxidized silicon layer 13. A channel region layer with a very short channel, well in the sub-micron region, may in this way be exactly produced in a very simple and reliable manner. This channel region layer 15 has preferably a low doping concentration of $10^{16}$–$5 \times 10^{17}$ cm$^{-3}$, which will be possible and still obtain a transistor capable to block comparatively high voltages when reversed biased due to the potential dividing property of the buried grid structure 5 described more in detail below.

Figure 10:
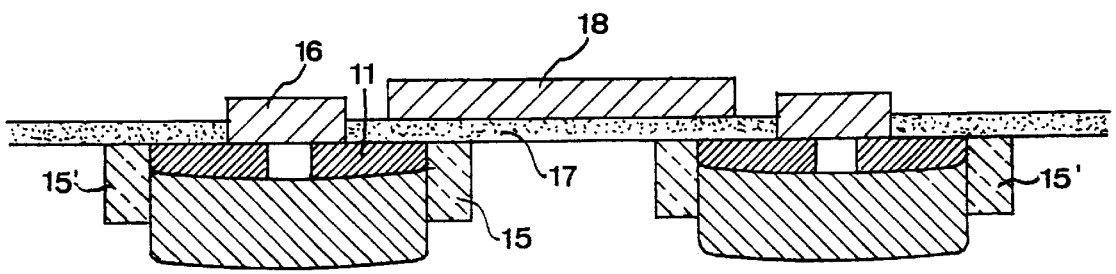

It is illustrated in FIG. 10 how a source contact 16 is then applied in a conventional way on top of the source region layer 11. An insulating layer 17, for example of SiO$_2$, is applied on top of the device for passivation thereof and for insulating a gate contact 18 applied on top thereof and to extend laterally at least over the entire lateral extension of each channel region layer 15. It is noted that FIG. 7 as well as FIG. 1 have been simplified in the sense that no gate contact has been shown for the outermost channel region layers 15', although a gate electrode will in practice also be arranged there. The device may also be provided with a much thicker insulating passivation layer on top of the structure shown in FIG. 10.

It is important for the function of the transistor that the buried regions 6 have a fixed potential, which is normally obtained by shorting them to for instance the source. The function of the grid will namely be as follows. In the forward conducting state of the transistor the regions 19 of the drift layer located between adjacent grid regions will be of n-type and enable an electron transport therethrough and between the drain 20 and the source 16 of the transistor through a conducting inversion channel formed in the channel region layer by applying a positive voltage on the gate contact 18 between the drift layer and the source region layer 11.

However, when the transistor is in the forward blocking state the positive voltage applied on the drain and thus on the substrate will expand the depletion regions surrounding each region 6 of the buried grid, so that the regions 19 between adjacent buried grid regions 6 will be totally depleted and by that a pn-junction will be formed deep in the drift layer. This pn-junction will act as a potential divider and take a major part of the voltage drop over the transistor, so that the electric field in the vicinity of the channel 21 in the channel region layer and thereby at the insulating layer 17 will be dramatically limited, and this region will not as in conventional MOSFETs see the maximum field. The advantages of this fact have been thoroughly discussed above.

The spacing "S" of the grid is defined as the distance between two adjacent buried regions 6 as shown in FIG. 1, and this spacing as well as the doping concentration of the buried regions 6 may be optimized to form a trade-off between voltage blocking capability and parasitic contribution of the grid to on-state losses. This will be further discussed with reference to FIG. 11 and 12.

The transistor has several active regions arranged with a certain pitch p, and this pitch is defined as the center-to-center distance between two adjacent active region structures as shown in FIG. 1. The pitch increases with the density at which such active regions are arranged.

Figure 11:
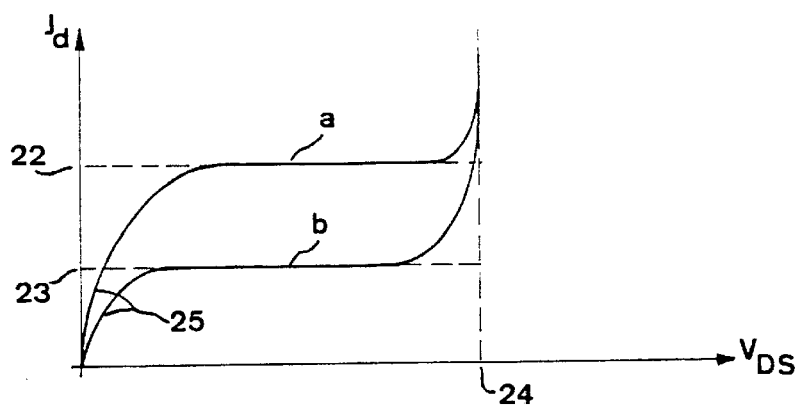
FIG. 11 is a graph of the current density versus the voltage applied over a device of the type shown in FIG. 1 in the forward blocking direction thereof for two different pitches, but with the same spacing between adjacent regions of the buried grid and with positive voltage applied to the gate.

It is illustrated in FIG. 11 how the current density $J_d$ of a transistor according to FIG. 1 is varying by the voltage $V_{DS}$ between the drain and the source of the transistor for two different pitches, namely a small pitch "a" and large pitch "b". The gate voltage and the spacing "S" are the same for both cases. The horizontally dashed lines 22, 23 correspond to the respective saturation current density, and the vertically dashed line 24 indicates a breakdown voltage of the transistor. It is noted that the saturation current density may be varied by changing the pitch without influencing the value of the breakdown voltage of the transistor. The smaller the pitch, the higher saturation current density. A smaller pitch also results in a lower on-state resistance of the device defined through the lower part 25 of the curves.

Figure 12:
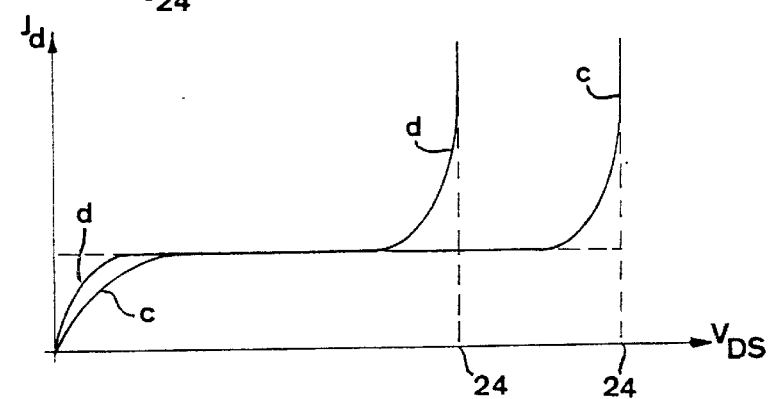
FIG. 12 is a graph corresponding to that of FIG. 11 for two different spacings, but with the same pitch.

FIG. 12 is a graph similar to that of FIG. 11, but here the pitch and the gate voltage are constant, and the relationship between $J_d$ and $V_{DS}$ is shown for a small spacing "C" and a larger spacing "d". The pitch is in this case the same as for the curve "b" in. FIG. 11, i.e. large. It is shown that the level of the breakdown voltage may be changed by changing the spacing between the buried regions of the grid without changing the saturation current density of the transistor. It also appears from FIG. 12 that the on-state resistance of the transistor will be influenced by the spacing and be higher at smaller spacings (c).

Accordingly, in a transistor of this type it is possible to independently determine the saturation current density by varying the pitch "p" and the breakdown voltage by varying the spacing of the grid. These properties may of course also be influenced by the doping concentration and the thickness of the different layers of the device, but when these are constant the saturation current density and the breakdown voltage depend on the pitch and the spacing as shown in FIG. 11 and 12. It is emphasized that it is not always desirable to have a saturation current density as high as possible, since one may want to limit the current in case of a failure, such as a short-circuit, and it is important to stay within the SOA (Safe Operation Area) of the device. Typical dimensions for the pitch and spacing are 10–100 μm and 1–10 μm, respectively.

Figure 13:
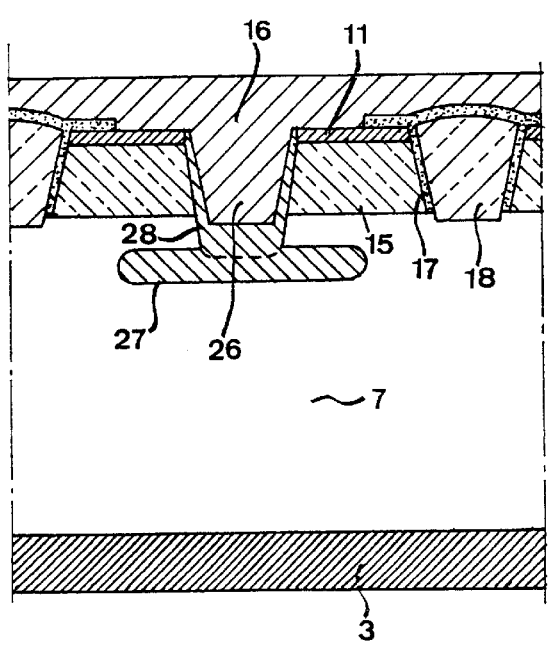
FIG. 13 is a simplified sectioned view of a transistor according to a second preferred embodiment of the invention.

A device in the form of a MOSFET according to a second preferred embodiment of the invention is shown in FIG. 13. Layers corresponding to layers present in the device according to FIG. 1 are given the same reference numerals and will not be discussed further here. The gate electrode 18 is here arranged in a trench and the insulating layer 17 separating it from the channel region layer 15 is arranged on the trench wall. Thus a substantially vertical conducting inversion channel may be formed in the channel region layer at the interface between the insulating layer 17 and the channel region layer 15. Furthermore, a further trench 26 is provided laterally to the trench having the gate 18, and a highly doped p-type region 27 is buried in the drift layer below this trench and connected to the source contact 16. This buried layer 27 will in the blocking state of the device bend the electric field lines towards it and away from the insulating layer 17 and the channel region layer 15, so that this insulating layer 17 will be protected and the channel region layer may have a lower doping concentration and still not be totally depleted in the blocking state, so that the on-state resistance of the inversion channel will be lower.

In the embodiment according to FIG. 13 the buried layer 27 is connected to a highly doped p-type region 28 located in the bottom and the walls of the trench and obtained by ion implantation. The buried region 27 is preferably obtained in the same way as the buried regions 6 in the structure according to FIG. 1 by a combination of implantation and regrowth.

Figure 14:
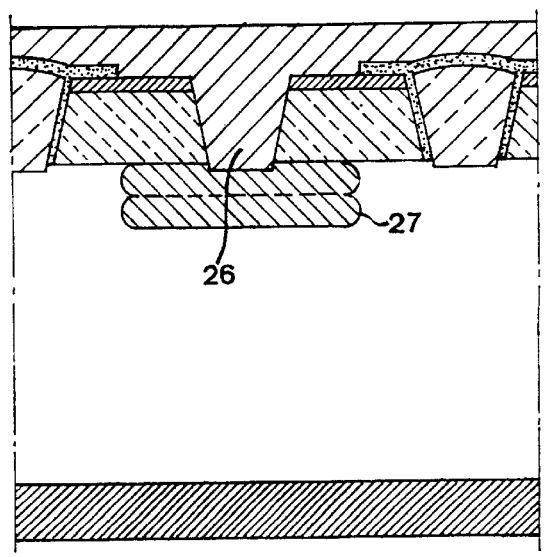
FIG. 14 is a view corresponding to that of FIG. 13 of a transistor according to a third preferred embodiment of the invention being slightly modified with respect to that shown in FIG. 13.

The embodiment according to FIG. 14 differs from that according to FIG. 13 in that the buried region 27 extends all the way to the trench 26, so that no implantation into the bottom of the trench is necessary for making a contact to the buried region. Accordingly, the comparatively deep location of the lower limit of the buried region is here obtained by implantation, regrowth and then implantation again and then regrowth for forming the layer out of which the channel region layer and source region layer may be formed.

The invention is of course not in any way restricted to the preferred embodiments described above, but many possibilities to modifications thereof would be apparent to a man with ordinary skill in the art without departing from the basic idea of the invention.

The base layer in a transistor according to FIG. 1 does not need to be highly doped, but it may be moderately doped, for instance having a doping concentration of $10^{18}$–$10^{19}$ cm$^{-3}$.

It will of course be possible to make the substrate layer of p-type for obtaining a bipolar device, such as an IGBT. It will then be preferred to have a highly doped n-type buffer layer between the substrate layer and the drift layer.

The number of layers mentioned in the claims is a minimum number, and it is within the scope of the invention to arrange further layers in the devices or dividing any layer into several layers by selective doping of different regions thereof.

"Substrate layer" is in this disclosure to be interpreted as the layer closest to the drain of the layers mentioned and it has not to be a substrate layer in the strict sense of the word within this field, i.e. the layer from which the growth is started. The real substrate layer may be any of the layers and is mostly the thickest one, which may be the drift layer.

"Device of SiC" or "transistor of SiC" do not exclude that some parts of the device or transistor are made of another material, such as contacts and insulating layers.

"Transistor" as defined in the claims refers actually to the entire semiconductor device, which in the case of the invention comprises a low voltage transistor part and a high voltage grid (JFET).

What is claimed is:

1. A semiconductor device of SiC comprising three terminals so that a high voltage can be maintained between two of said terminals in a blocking state of the device, said third terminal being used as a controlling electrode so that the device has a transistor action and is of the insulated gate type, the device further comprising two parts, each comprising one or more semiconductor layers of SiC, said parts being connected in series between said two terminals, one of the parts being a sub-semiconductor device adapted to control current flow in the on-state and capable to withstand only low voltages in the blocking state thereof and a second part being a voltage-limiting part capable to withstand high voltages in the blocking state of the device and adapted to protect said sub-semiconductor device by taking a major part of the voltage over the device in the blocking state thereof, the voltage limiting part being located at a distance from the sub-semiconductor device and comprising a plurality of buried regions of a first conductivity type buried in a layer of an opposite second conductivity type at a distance below said sub-semiconductor device, said buried regions being laterally spaced from each other and forming a grid, in the blocking state of the device regions between the buried regions become depleted to form a continuous layer of said first conductivity type and, by that, a pn-junction at a distance from said sub-semiconductor device taking a major part of the voltage drop over the device in a blocking state thereof, said buried regions being provided with contacts for giving said buried regions a fixed potential.

2. A device according to claim 1, wherein said first conductivity type is p.

3. A device according to claim 1, wherein said sub-semiconductor device is a gate-controlled device with an insulating layer between a gate and a channel region layer.

4. A device according to claim 1, wherein said sub-semiconductor device is a MISFET and/or IGBT, and said voltage-limiting part has a JFET-like structure.

5. A transistor of SiC having an insulated gate and comprising superimposed in the order mentioned:
   a drain region,
   a highly doped substrate layer,
   a low-doped n-type drift layer,
   an active region having a highly doped n-type surface-near layer arranged at the top of the drift layer,
   a contact arranged on top of the surface-near layer,
   a p-type channel region layer separating the surface-near layer from the drift layer,
   an insulating layer located next to the channel region layer and extending at least from the surface-near layer to the drift layer and a gate electrode arranged on the insulating layer and adapted to form a conducting inversion channel extending in the channel region layer at the interface to the insulating layer for electron transport from the contact to the drain region upon applying a voltage thereto;
   a plurality of buried p-type regions buried in the drift layer at a distance below said p-type channel region layer, said buried regions being laterally spaced from each other and forming a grid adapted to form a continuous p-type layer in the blocking state of the transistor and by that a pn-junction at a distance below said p-type channel region layer taking a major part of the voltage drop over the transistor in a blocking state thereof; and
   second contacts on the buried regions providing a fixed potential thereto.

6. A transistor according to claim 5, further comprising more than one of said active regions laterally spaced with respect to each other are arranged with a fixed pitch (p), and that said pitch and the spacing (s) between said additional p-type regions of the buried grid are selected for obtaining a desired on-state resistance and breakdown voltage, respectively, of the transistor.

7. A transistor according to claim 5, wherein the insulating layer is arranged on top of the channel region layer and the gate electrode on top thereof for forming a lateral conducting inversion channel between the surface-near layer and the drift layer.

8. A transistor according to claim 5, further comprising a p-type base layer located above the additional buried p-type region and below the surface-near layer, and the base layer is arranged to separate the surface-near layer from the drift layer.

9. A transistor according to claim 5, wherein said buried region is highly doped.

10. A transistor according to claim 5, wherein the channel region layer is low doped.

11. A transistor according to claim 5, wherein the doping concentration of the channel region layer is between $10^{16}$ and $5-10^{17}$ cm$^{-3}$.

12. A transistor according to claim 5, wherein the channel region layer is thin in the lateral direction of said channel resulting in a short inversion channel therein.

13. A transistor according to claim 5, wherein the length of said channel is less than 2 $\mu$m.

14. A transistor according to claim 5 wherein said transistor is a MISFET.

15. A transistor according to claim 14 wherein said highly doped substrate layer is of n-type.

16. A transistor according to claim 5 wherein said transistor is an IGBT and said highly doped substrate layer is of p-type.

17. A transistor according to claim 16 further comprising a highly doped n-type buffer layer formed on top of said highly doped substrate layer.

* * * * *